United States Patent
Lee et al.

(10) Patent No.: US 9,603,265 B2
(45) Date of Patent: Mar. 21, 2017

(54) MULTI-LAYERED PRINTED CIRCUIT BOARD HAVING INNER-LAYER PORTION AND OUTER-LAYER PORTIONS AND MANUFACTURING METHOD THEREOF

(71) Applicant: SAMSUNG ELECTRO-MECHANICS CO., LTD., Suwon-Si, Gyeonggi-Do (KR)

(72) Inventors: Ji-Won Lee, Changwon (KR); Jin-Kyu Kim, Busan (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/705,586

(22) Filed: May 6, 2015

(65) Prior Publication Data

US 2016/0013108 A1    Jan. 14, 2016

(30) Foreign Application Priority Data

Jul. 8, 2014   (KR) .................. 10-2014-0085143

(51) Int. Cl.
| | |
|---|---|
| *H05K 1/11* | (2006.01) |
| *H05K 3/46* | (2006.01) |
| *H01L 23/498* | (2006.01) |
| *H01L 21/48* | (2006.01) |
| *H05K 3/42* | (2006.01) |
| *H05K 1/02* | (2006.01) |

(52) U.S. Cl.
CPC ............. *H05K 3/46* (2013.01); *H01L 21/486* (2013.01); *H01L 21/4853* (2013.01); *H01L 21/4857* (2013.01); *H01L 23/49811* (2013.01); *H01L 23/49822* (2013.01); *H01L 23/49827* (2013.01); *H01L 23/49894* (2013.01); *H05K 1/0268* (2013.01); *H05K 3/429* (2013.01); *H05K 3/4617* (2013.01); *H05K 3/4673* (2013.01); *H01L 23/49833* (2013.01); *H01L 2924/0002* (2013.01)

(58) Field of Classification Search
CPC ........ H05K 3/46; H05K 3/429; H05K 3/4617; H01L 23/49822; H01L 23/49811
USPC ................ 174/262, 250, 251, 255, 257, 258
See application file for complete search history.

(56) References Cited

U.S. PATENT DOCUMENTS 8,737,085 B2 *   5/2014   Sasaoka ................. H05K 1/188
                                                                    174/250

* cited by examiner

*Primary Examiner* — Tremesha S Willis
(74) *Attorney, Agent, or Firm* — NSIP Law (57) ABSTRACT

A multi-layered printed circuit board and a manufacturing method thereof are disclosed. The multi-layered printed circuit board in accordance with an aspect of the present invention includes: an inner-layer portion having an inner-layer wired pattern formed thereon; outer-layer portions having inner-layer wired portions formed thereon and being laminated on either surface of the inner-layer portion; a first via-hole formed to penetrate one of the outer-layer portions so as to be connected to a first point of the inner-layer wired pattern; and a second via-hole formed to penetrate the other of the outer-layer portions so as to be connected with a second point of the inner-layer wired pattern. The second via-hole is formed in an area of the inner-layer portion and the outer-layer portions that is removed through external form processing.

9 Claims, 7 Drawing Sheets

MULTI-LAYERED PRINTED CIRCUIT BOARD HAVING INNER-LAYER PORTION AND OUTER-LAYER PORTIONS AND MANUFACTURING METHOD THEREOF

CROSS-REFERENCE TO RELATED APPLICATIONS

This application claims the benefit of Korean Patent Application No. 10-2014-0085143, filed with the Korean Intellectual Property Office on Jun. 8, 2014, the disclosure of which is incorporated herein by reference in its entirety.

BACKGROUND

1. Technical Field

The present invention relates to a multi-layered printed circuit board and a manufacturing method thereof.

2. Background Art

General fabrication processes of printed circuit boards involve a process of forming a plurality of wired patterns on a substrate, a testing process of checking the quality of each wired pattern, a process of packaging quality-approved printed circuit boards and a process of putting the packaged printed circuit boards in a final test.

Here, the testing process, in which electrical properties of the wired patterns are tested, includes a process of giving an open/short test (OS test) to the wired patterns. Currently, a widely used process of performing the OS test for the fabricated wired patterns relies on a probe instrument equipped with probe pins that are electrically accessed to the wired patterns.

Meanwhile, testing for open-circuit in the wired patterns is only possible if there are at least two test points, but there may be only one test point connected to an outside, depending on the type of wired pattern.

Accordingly, in case there is only one test point, it is difficult to pre-detect the open-circuit, and the defect is inevitably discovered in the final product. Therefore, there has been a demand for measures that enable a test for the wired pattern even if there is only one test point.

The related art of the present invention is disclosed in Korea Patent Publication No. 10-2014-0042326 (laid open on Apr. 7, 2014).

SUMMARY

An embodiment of the present invention provides a multi-layered printed circuit board and a manufacturing method thereof, in which a temporary via-hole is additionally formed in an inner-layer wired pattern, of which only one point is connected with an outer-layer, when the multi-layered printed circuit board is manufactured, allowing for testing for open-circuit.

Here, the temporary via-hole is formed in an area that is removed through external form processing and thus may not affect the structure of a final product after the testing for open-circuit.

DETAILED DESCRIPTION

Hereinafter, a multi-layered printed circuit board and a manufacturing method thereof in accordance with the present invention will be described with reference to the accompanying drawings. In describing the present invention with reference to the accompanying drawings, any identical or corresponding elements will be assigned with same reference numerals, and their description will not be provided redundantly.

Terms such as "first" and "second" may be used in describing various elements, but the above elements shall not be restricted to the above terms. The above terms are used only to distinguish one element from the other.

When one element is described to be "coupled" to another element, it does not refer to a physical, direct contact between these elements only, but it shall also include the possibility of yet another element being interposed between these elements and each of these elements being in contact with said yet another element.

Figure 1:
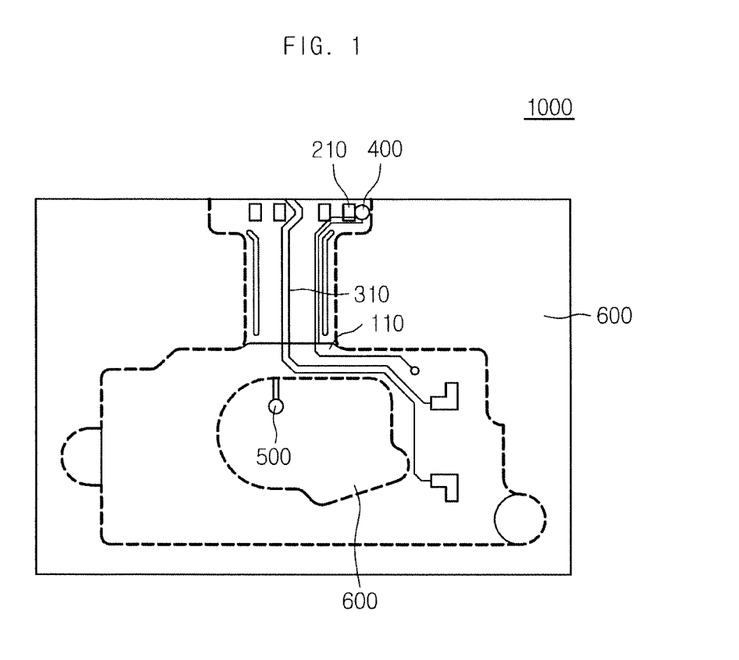
FIG. 1 shows wired patterns overlapped in a multi-layered printed circuit board in accordance with an embodiment of the present invention.
Figure 2:
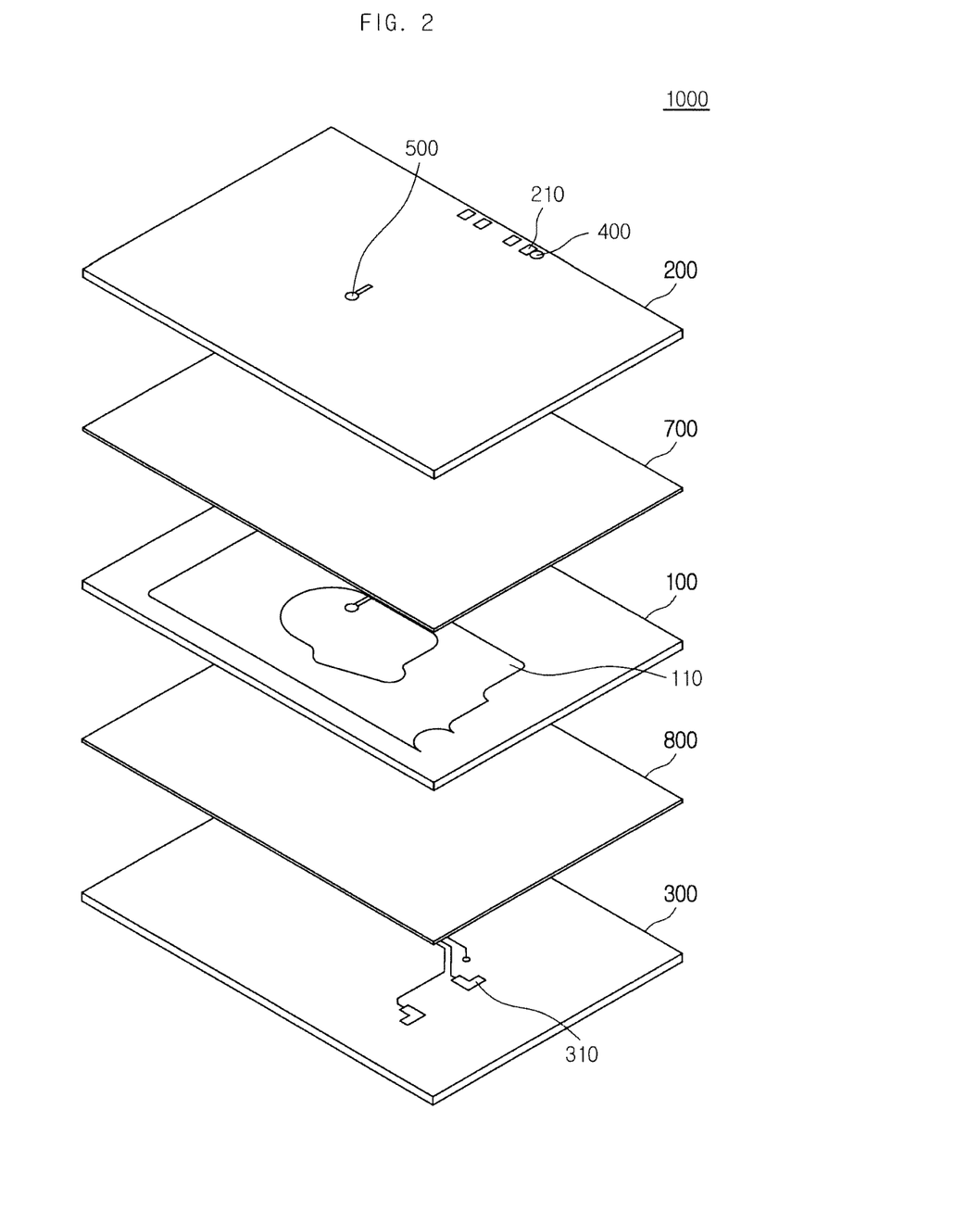
FIG. 2 is an exploded perspective view showing the multi-layered printed circuit board in accordance with an embodiment of the present invention.

FIG. 1 shows wired patterns overlapped in a multi-layered printed circuit board in accordance with an embodiment of the present invention. FIG. 2 is an exploded perspective view showing the multi-layered printed circuit board in accordance with an embodiment of the present invention.

As illustrated in FIG. 1 and FIG. 2, a multi-layered printed circuit board 1000 may include an inner-layer portion 100, outer-layer portions 200, 300, a first via-hole 400 and a second via-hole 500, and may further include prepreg layers 700, 800.

The inner-layer portion 100, where an inner-layer wired pattern 110 is formed, may be constituted with a thin core, such as a copper clad laminate. In such a case, the inner-layer wired pattern 110, which is a circuit pattern such as a power circuit, a ground circuit or a signal circuit formed to perform specific functions, may be formed on the thin core through, for example, an image forming process.

For example, a predetermined wired pattern 110 may be transcribed on the inner-layer portion 100 by laminating, exposing and then developing a dry film on the thin core, Then, the inner-layer wired pattern 110 may be formed on the inner-layer portion 100 by removing a copper film that is not protected by the dry film through, for example, a corrosion process and then removing the dry film.

The outer-layer portions 200, 300, which have outer-layer wired patterns 210, 310 formed thereon and are laminated on either surface of the inner-layer portion 100, may be laminated by laying and pressing a copper clad laminate or the like on both surfaces of the inner-layer portion 100. In such a case, the outer-layer wired patterns 210, 310, which are also circuit patterns formed according to predetermined functions, may be formed through similar processes as the inner-layer wired pattern 110.

Moreover, the outer-layer wired patterns 210, 310 may include a terminal 210, which is formed where an electrical contact is made, and a mark, which displays various information of a product, and may be protected by solder resist (PSR) or the like.

The first via-hole 400, which is formed to penetrate the outer-layer portion 200 for connection with a first point of the inner-layer wired pattern 110 and which has an inside thereof plated, may allow the first point of the inner-layer wired pattern 110 to be electrically connected with an outside.

Here, the first via-hole 400 may be formed through, for example, drilling, and an inner wall of the first via-hole 400 may be plated through electroless copper plating or electrolytic copper plating. Moreover, the first via-hole 400 may be formed to connect the outer-layer wired patterns 210, 310, which are formed on the outer-layer portions 200, 300, respectively, with each other.

The first point, which refers to a predetermined position of the inner-layer wired pattern 110, may be electrically connected with the outer-layer wired pattern 210 or exposed through the first via-hole 400.

Meanwhile the inner-layer wired pattern 110 may not be exposed, by being covered by the outer-layer portion 200. Accordingly, the inner-layer wired pattern 110 may be connected with the outer-layer wired pattern 210 or exposed through the first via-hole 400.

Depending on the type of the inner-layer wired pattern 110, there may be a case where only one point is connected with the outer-layer wired pattern 210 or exposed. However, two test points are required in order to test the inner-layer wired pattern 110 for any open-circuit.

Therefore, pre-detecting any open-circuit may be difficult if, as described above, there is only one test point because only one point is connected with the outer-layer wired pattern 210 or exposed, depending on the type of the inner-layer wired pattern 110.

Accordingly, by including the second via-hole 500, the multi-layered printed circuit board 1000 in accordance with the present embodiment may be able to carry out an open-circuit test in the above-described case as well.

Specifically, the second via-hole 500, which is formed to penetrate the outer-layer portion 200 for connection with a second point of the inner-layer wired pattern 110 and which has an inside thereof plated, may allow the second point of the inner-layer wired pattern 110 to be electrically connected with an outside. Here, the second via-hole 500 may be formed through, for example, drilling, and an inner wall of the second via-hole 500 may be plated through electroless copper plating or electrolytic copper plating.

The second point, which refers to another predetermined position of the inner-layer wired pattern 110 that is different from the first point, may be exposed through the second via-hole 500.

Meanwhile, the second via-hole 500, which is formed in an area 600 of the inner-layer portion 100 and the outer-layer portions 200, 300 that is removed through external form processing, is a temporary via-hole for an open-circuit test of the inner-layer wired pattern 110.

Here, the external form processing, which may include routing, is a process for fabricating the multi-layered printed circuit hoard 1000 of the present embodiment according to the dimensions and shape of an end product.

By forming the second via-hole 500 in the area 600 that is removed through the external form processing, the structure of the end product may not be affected by and after the open-circuit test.

Although it is illustrated in FIG. 2 that the first via-hole 400 and the second via-hole 500 are formed in the outer-layer portion 200 that is positioned at an upper part of FIG. 2, the present invention is not restricted to what is illustrated herein, and it is also possible that the first via-hole 400 and the second via-hole 500 are formed in the outer-layer portion 300 that is positioned at a lower part of FIG. 2.

The prepreg layers 700, 800, which are interposed between the inner-layer portion 100 and the outer-layer portions 200, 300 so as to insulate the inner-layer portion 100 from the outer-layer portions 200, 300, may attach the inner-layer portion 100 with the outer-layer portions 200, 300 through curing.

Here, the prepreg layers 700, 800 may be layers that are made to a semi-hardened state by impregnating thermosetting resin in glass fiber and may be classified according to a material thickness, a resin amount and a resin fluidity.

As such, in the multi-layered printed circuit board 1000 in accordance with the present embodiment, the prepreg layers 700, 900 are interposed between the inner-layer portion 100 and the outer-layer portions 200, 300, and thus attachment between the inner-layer portion 100 and the outer-layer portions 200, 300 may be readily made and short-circuit between the inner-layer wired pattern 110 and the outer-layer wired patterns 210, 310 may be prevented.

In the multi-layered printed circuit board 1000 in accordance with the present embodiment, the inner-layer wired pattern 110 may have open-circuit thereof measured through an electrical test between the first via-hole 400 and the second via-hole 500.

Figure 9:
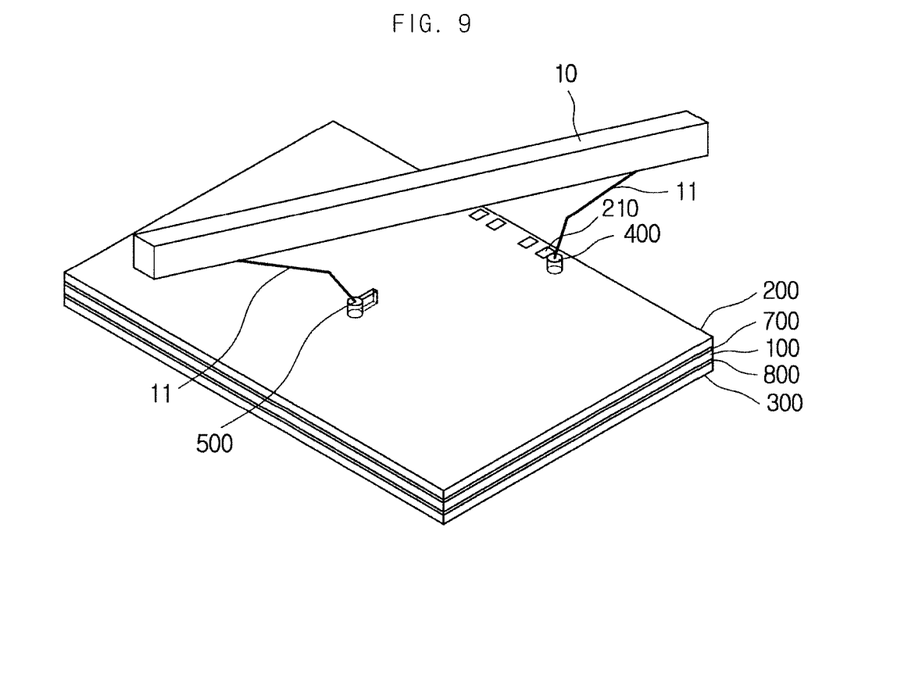

That is, the electrical test for open-circuit may be made by connecting test pins (reference numeral 11 in FIG. 9) to the first via-hole 400 and the second via-hole 500 through a separate electrical test instrument (reference numeral 10 in FIG. 9). Moreover, it is also possible to conduct the electrical test for open-circuit by connecting the test pins (reference numeral 11 in FIG. 9) to the terminal 210, which is connected to the first via-hole 400, and the second via-hole 500.

Accordingly, it is possible to pre-detect any open-circuit before the end product is completed, thereby improving the productivity and managing the quality efficiently.

Figure 3:
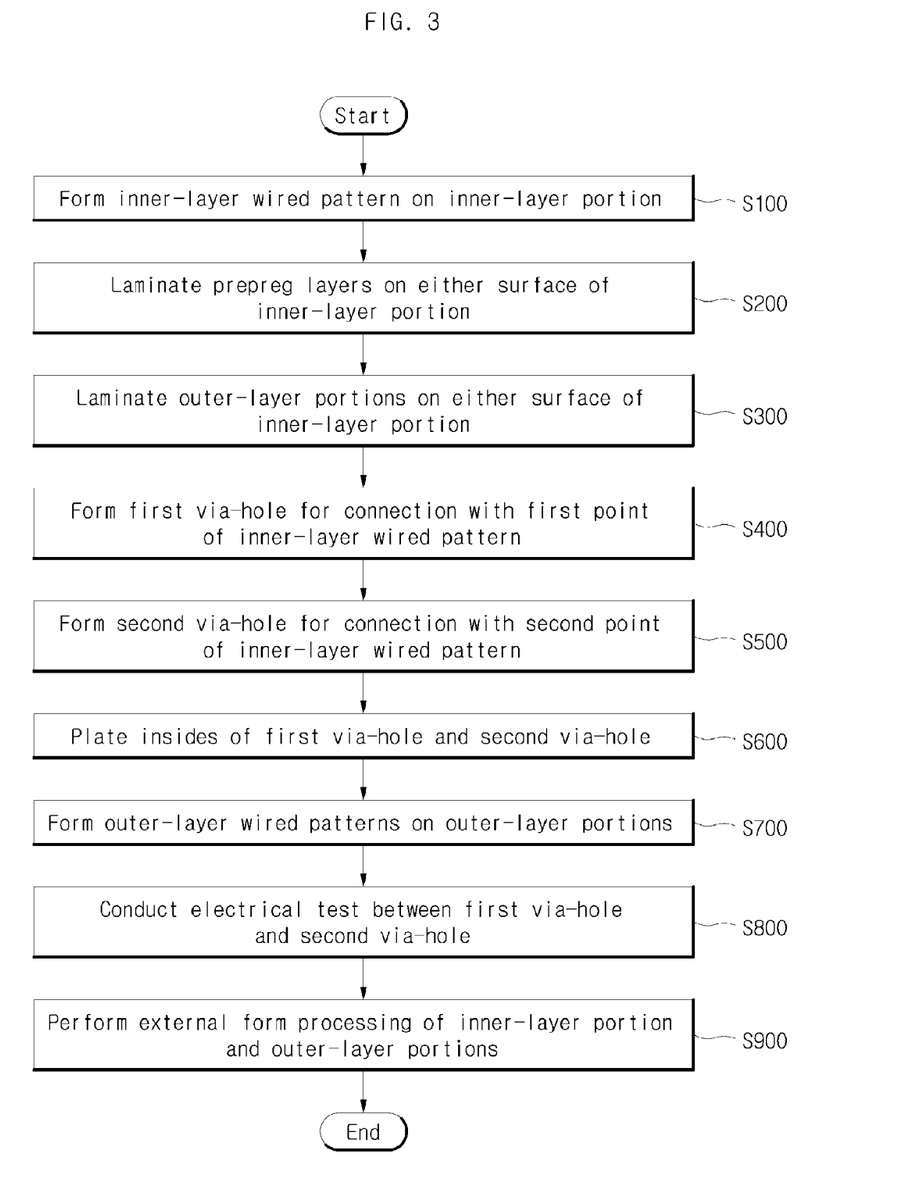
FIG. 3 is a flow diagram showing a method of manufacturing a multi-layered printed circuit board in accordance with an embodiment of the present invention.

FIG. 3 is a flow diagram showing a method of manufacturing a multi-layered printed circuit board in accordance with an embodiment of the present invention. FIG. 4, FIG. 5, FIG. 6, FIG. 7, FIG. 8, FIG. 9 and FIG. 10 show major processes of the method of manufacturing a multi-layered printed circuit board in accordance with an embodiment of the present invention.

Figure 4:
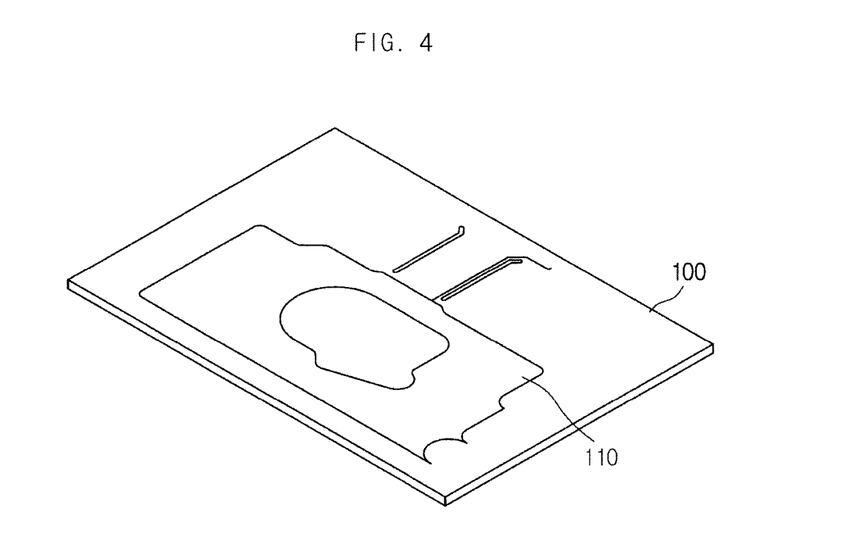
FIG. 4, FIG. 5, FIG. 6, FIG. 7, FIG. 8, FIG. 9 and FIG. 10 show major processes of the method of manufacturing a multi-layered printed circuit board in accordance with an embodiment of the present invention.

As illustrated in FIG. 3 to FIG. 10, the method of manufacturing a multi-layered printed circuit board in accordance with an embodiment of the present invention starts with forming an inner-layer wired pattern 110 on an inner-layer portion 100 (S100, FIG. 4).

Here, the inner-layer wired pattern 110, which is a circuit pattern such as a power circuit, a ground circuit or a signal circuit formed to perform specific functions, may be formed on a thin core through, for example, an image forming process.

Figure 6:
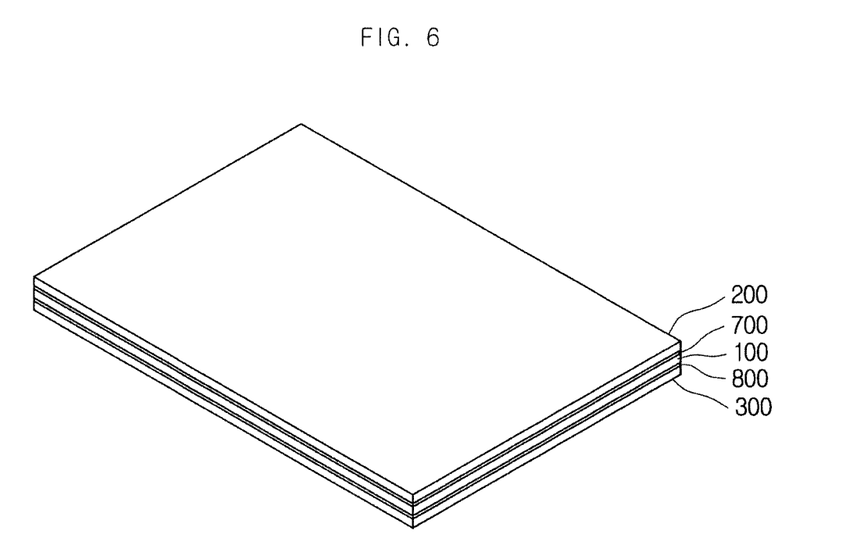

Then, outer-layer portions 200, 300 are laminated on either surface of the inner-layer portion 100 (S300, FIG. 6). Here, the outer-layer portions 200, 300 may be laminated by laying and pressing a copper clad laminate or the like on both surfaces of the inner-layer portion 100.

Figure 7:
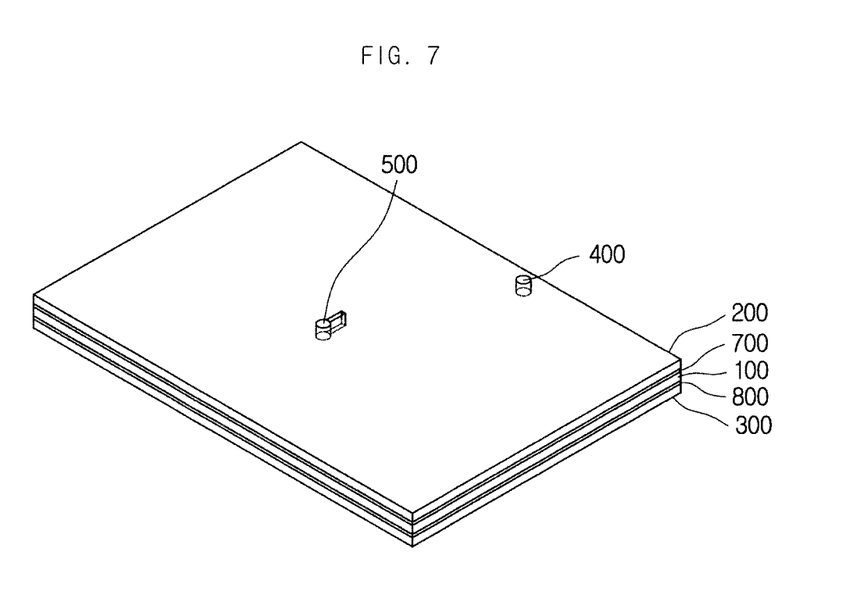

Next, a first via-hole 400 is formed to penetrate the outer-layer portion 200 for connection with a first point of the inner-layer wired pattern 110 (S400, FIG. 7). Here, the first point refers to a predetermined position of the inner-layer wired pattern 110 and may be electrically connected with an outer-layer wired pattern 210 or exposed through the first via-hole 400.

Afterwards, a second via-hole 500 is formed to penetrate the outer-layer portion 200 for connection with a second point of the inner-layer wired pattern 110 (S500, FIG. 7). Here, the second point refers to another predetermined position of the inner-layer wired pattern 110 that is different from the first point and may be exposed through the second via-hole 500.

Meanwhile, the second via-hole 500 is formed in an area 600 of the inner-layer portion 100 and the outer-layer portions 200, 300 that is removed through external form processing, and is a temporary via-hole for an open-circuit test of the inner-layer wired pattern 110.

Next, insides of the first via-hole 400 and the second via-hole 500 are plated (S600, FIG. 7). Here, inner walls of the first via-hole 400 and the second via-hole 500 may be plated through electroless copper plating or electrolytic copper plating.

Figure 8:
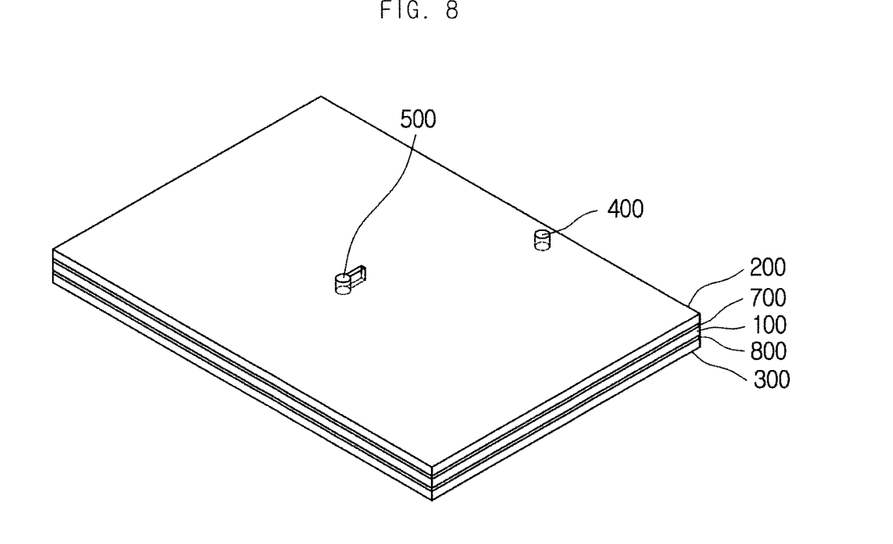

Thereafter, outer-layer wired patterns 210, 310 are formed on the outer-layer portions 200, 300 (S700, FIG. 8). Here, the outer-layer wired patterns 210, 310 are also circuit patterns formed according to predetermined functions and may be formed through similar processes as the inner-layer wired pattern 110.

Moreover, the outer-layer wired patterns 210, 310 may include a terminal 210, which is formed where an electrical contact is made, and a mark, which displays various information of a product, and may be protected by solder resist (PSR) or the like.

As described above, according the method of manufacturing a multi-layered printed circuit board in accordance with the present embodiment, an open-circuit test may be possible, owing to the forming of the second via-hole 500, even if there is only one test point because only one point is connected with the outer-layer wired pattern 210 or exposed.

Moreover, by forming the second via-hole 500 in the area 600 that is removed through the external form processing, the structure of an end product may not be affected by and after the open-circuit test.

The method of manufacturing a multi-layered printed circuit board in accordance with the present embodiment may further include forming prepreg layers 700, 800 on either surfaces of the inner-layer portion 100 (S200, FIG. 5), prior to the S300 step.

Figure 5:
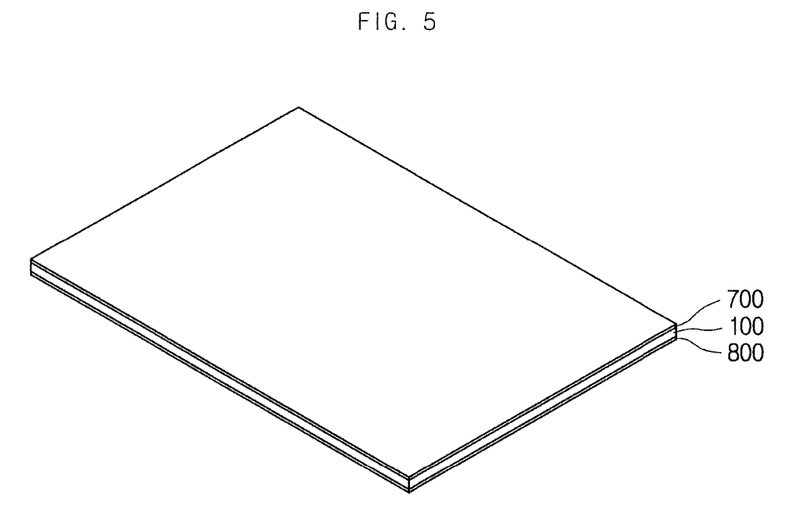

As the prepreg layers 700, 900 are interposed between the inner-layer portion 100 and the outer-layer portions 200, 300, attachment between the inner-layer portion 100 and the outer-layer portions 200, 300 may be readily made, and short-circuit between the inner-layer wired pattern 110 and the outer-layer wired patterns 210, 310 may be prevented.

The method of manufacturing a multi-layered printed circuit board in accordance with the present embodiment may further include conducting an electrical test between the first via-hole 400 and the second via-hole 500 (S800, FIG. 9), after the S700 step. That is, the electrical test for open-circuit may be conducted by connecting test pins 11 to the first via-hole 400 and the second via-hole 500 through a separate electrical test instrument 10.

Accordingly, it is possible to pre-detect any open-circuit before the end product is completed, thereby improving the productivity and managing the quality efficiently.

The method of manufacturing a multi-layered printed circuit board in accordance with the present embodiment may further include performing an external form processing of the inner-layer portion 100 and the outer-layer portions 200, 300 (S900, FIG. 10), after the S800 step.

Figure 10:
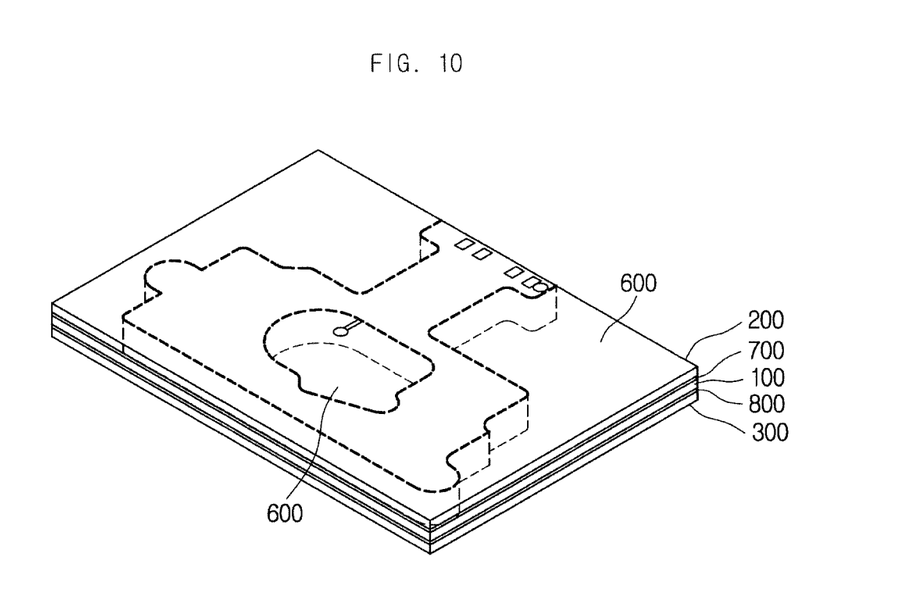

Here, the external form processing, which may include routing, is a process for fabricating the multi-layered printed circuit board 1000 of the present embodiment according to the dimensions and shape of the end product.

Although certain embodiments of the present invention have been described above, it shall be appreciated that there can be a variety of permutations and modifications of the present invention by those who are ordinarily skilled in the art to which the present invention pertains without departing from the technical ideas and scope of the present invention, which shall be defined by the appended claims. It shall be also appreciated that a large number of other embodiments than the above-described embodiments are included in the claims of the present invention.

What is claimed is:

1. A multi-layered printed circuit board comprising:
   an inner-layer portion having an inner-layer wired pattern formed thereon;
   outer-layer portions having outer-layer wired patterns formed thereon and being laminated on either surface of the inner-layer portion;
   a first via-hole formed to penetrate one of the outer-layer portions so as to be connected to a first point of the inner-layer wired pattern; and
   a second via-hole formed to penetrate the one of the outer-layer portions so as to be connected with a second point of the inner-layer wired pattern,
   wherein the second via-hole is formed in an area of the inner-layer portion and the outer-layer portions that is subsequently removed through external form processing.

2. The multi-layered printed circuit board of claim 1, further comprising prepreg layers interposed between the inner-portion layer and the outer-portion layers so as to insulate the inner-portion layer from the outer-portion layers.

3. The multi-layered printed circuit board of claim 1, wherein the inner-layer wired pattern has open-circuit thereof measured through an electrical test between the first via-hole and the second via-hole.

4. A method of manufacturing a multi-layered printed circuit board, comprising:
   forming an inner-layer wired pattern on an inner-layer portion;
   laminating outer-layer portions on either surface of the inner-layer portion;
   forming a first via-hole to penetrate one of the outer-layer portions so as to be connected with a first point of the inner-layer wired pattern;
   forming a second via-hole to penetrate the one of the outer-layer portions so as to be connected with a second point of the inner-layer wired pattern;
   plating insides of the first via-hole and the second via-hole;
   forming outer-layer wired patterns on the outer-layer portions; and
   removing the second via-hole and an area of the inner-layer portion and the outer-layer portion surrounding the second via-hole.

5. The method of claim 4, further comprising laminating prepreg layers on either surface of the inner-layer portion, prior to the laminating of the outer-layer portions.

6. The method of claim 4, further comprising conducting an electrical test between the first via-hole and the second via-hole, after the forming of the outer-layer wired patterns.

7. The method of claim 6, the removing of the second via-hole and the area of the inner-layer portion and the outer layer portion surrounding the second via-hole is performed after the conducting of the electrical test.

8. The multi-layered printed circuit board of claim 2, wherein the inner-layer wired pattern has open-circuit thereof measured through an electrical test between the first via-hole and the second via-hole.

9. The method of claim 5, further comprising conducting an electrical test between the first via-hole and the second via-hole, after the forming of the outer-layer wired patterns.

* * * * *